(12) United States Patent
Tanimoto et al.

(10) Patent No.: US 9,136,400 B2
(45) Date of Patent: Sep. 15, 2015

(54) SEMICONDUCTOR DEVICE (75) Inventors: Satoshi Tanimoto, Yokohama (JP);
Norihiko Kiritani, Yokosuka (JP);
Toshiharu Makino, Tsukuba (JP);
Masahiko Ogura, Tsukuba (JP); Norio Tokuda, Tsukuba (JP); Hiromitsu Kato, Tsukuba (JP); Hideyo Okushi, Tsukuba (JP); Satoshi Yamasaki, Tsukuba (JP)

(73) Assignees: NISSAN MOTOR CO., LTD., Yokohama-shi (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 440 days.

(21) Appl. No.: 12/934,199

(22) PCT Filed: Feb. 27, 2009

(86) PCT No.: PCT/JP2009/053715
§ 371 (c)(1),
(2), (4) Date: Sep. 23, 2010

(87) PCT Pub. No.: WO2009/119248
PCT Pub. Date: Oct. 1, 2009

(65) Prior Publication Data
US 2011/0017991 A1    Jan. 27, 2011

(30) Foreign Application Priority Data

Mar. 26, 2008  (JP) .................................. 2008-081975
Feb. 26, 2009  (JP) .................................. 2009-044570

(51) Int. Cl.
*H01L 21/00*    (2006.01)
*H01L 29/861*   (2006.01)
(Continued)

(52) U.S. Cl.
CPC .......... *H01L 29/861* (2013.01); *H01L 29/1602* (2013.01); *H01L 29/1608* (2013.01);
(Continued)

(58) Field of Classification Search
CPC ..... H01L 29/861; H01L 29/872; H01L 29/47; H01L 29/20; H01L 29/22; H01L 29/452; H01L 29/45; H01L 29/456; H01L 29/2003; H01L 29/475; H01L 29/1608; H01L 29/1602
See application file for complete search history.

(56) References Cited

U.S. PATENT DOCUMENTS
3,390,311 A * 6/1968 Aven et al. ..................... 257/78
(Continued)

FOREIGN PATENT DOCUMENTS
CN           1681135 A          10/2005
(Continued)

OTHER PUBLICATIONS
Kubovic et al ("Diamond Merged Diode", Diamond and Related Materials, 2007, pp. 1033-1037, vol. 16.*
(Continued)

*Primary Examiner* — Laura Menz
(74) *Attorney, Agent, or Firm* — Foley & Lardner LLP (57) ABSTRACT

In this junction element 1, when a forward voltage is applied, a depletion layer is formed in a semiconductor layer 2, prohibiting electrons present in an electrode layer 4 to move into the semiconductor layer 2. For this reason, a majority of holes in a semiconductor layer 3 do not disappear by recombination with conduction electrons in the semiconductor layer 2, but reach the electrode layer 4 while diffusing into the semiconductor layer 2. Accordingly, the junction element 1 can serve as a good conductor for holes, while avoiding the influence of a resistance value, and allows a current to flow therethrough at a level equal to or more than that achieved by a semiconductor element formed of a Si or SiC semiconductor. The present invention is applicable to any semiconductor material in which at least one of a donor level and an acceptor level is located at a sufficiently deep position beyond a thermal excitation energy at an operating temperature, such as diamond, zinc oxide (ZnO), aluminum nitride (AlN), or boron nitride (BN). The present invention is also applicable to even a material having a shallow impurity level at room temperature, such as silicon (Si), silicon carbide (SiC), gallium nitride (GaN), gallium arsenide (GaAs), or germanium (Ge), as long as operation is performed at such a low temperature that the thermal excitation energy can be sufficiently small.

10 Claims, 10 Drawing Sheets (51) Int. Cl.
- *H01L 29/16* (2006.01)
- *H01L 29/20* (2006.01)
- *H01L 29/22* (2006.01)
- *H01L 29/45* (2006.01)
- *H01L 29/47* (2006.01)
- *H01L 29/872* (2006.01)

(52) U.S. Cl.
CPC .......... *H01L29/20* (2013.01); *H01L 29/2003* (2013.01); *H01L 29/22* (2013.01); *H01L 29/45* (2013.01); *H01L 29/452* (2013.01); *H01L 29/456* (2013.01); *H01L 29/47* (2013.01); *H01L 29/475* (2013.01); *H01L 29/872* (2013.01)

(56) References Cited

U.S. PATENT DOCUMENTS

| | | | |
|---|---|---|---|
| 4,632,713 | A | 12/1986 | Tiku |
| 4,941,026 | A * | 7/1990 | Temple .................... 257/333 |
| 5,508,555 | A * | 4/1996 | Brotherton et al. ......... 257/650 |
| 6,727,171 | B2 * | 4/2004 | Takeuchi et al. ........... 438/624 |
| 7,135,774 | B2 * | 11/2006 | Tanimoto ................... 257/758 |
| 7,329,614 | B2 * | 2/2008 | Tanimoto ................... 438/768 |
| 2001/0015445 | A1 | 8/2001 | Nemoto |
| 2003/0155654 | A1 * | 8/2003 | Takeuchi et al. ........... 257/760 |
| 2004/0067324 | A1 * | 4/2004 | Lazarev et al. ............ 428/1.31 |
| 2005/0205941 | A1 * | 9/2005 | Tanimoto ................... 257/378 |
| 2007/0045782 | A1 * | 3/2007 | Tanimoto ................... 257/653 |
| 2007/0138482 | A1 * | 6/2007 | Tanimoto ................... 257/77 |
| 2007/0215873 | A1 | 9/2007 | Silver et al. |
| 2007/0215885 | A1 * | 9/2007 | Miyoshi et al. ............. 257/88 |
| 2011/0017991 | A1 * | 1/2011 | Tanimoto et al. ........... 257/43 |
| 2012/0168893 | A1 * | 7/2012 | Liu et al. ................... 257/471 |

FOREIGN PATENT DOCUMENTS

| | | |
|---|---|---|
| EP | 0 450 306 A1 | 10/1991 |
| EP | 1 503 425 A2 | 2/2005 |
| JP | 61-42877 B2 | 9/1986 |
| JP | 62-85469 A | 4/1987 |
| JP | 5-275467 A | 10/1993 |
| JP | 5-283361 A | 10/1993 |
| JP | 10-256572 A | 9/1998 |
| JP | 2000-091596 A | 3/2000 |
| JP | 2000-299386 A | 10/2000 |
| JP | 2000-340807 A | 12/2000 |
| JP | 2002-299643 A | 10/2002 |
| JP | 2005-223016 A | 8/2005 |
| JP | 2007-250720 A | 9/2007 |
| WO | WO 00/70684 A2 | 11/2000 |

OTHER PUBLICATIONS http://ecee.colorado.edu/~bart/book/book/chapter4/ch4_2.htm; Bart Van Zeghbroeck (2004).*
http://www.eecs.berkeley.edu/~hu/Chenming-Hu_ch4.pdf.*
S.J. Rashid et al., Numerical and Experimental Analysis of Single Crystal Diamond Schottky Barrier Diodes, Proceedings of the 17th International Symposium on Power Semiconductor Devices & IC's, May 2005, 4 pages.
Toshiharu Makino et al., Homoepitaxial Diamond $p$—$n^+$ Junction With Low Specific On-Resistance and Ideal Built-in Potential, Diamond and Related Materials, 2008, pp. 782-785, vol. 17.
S. Tanimoto et al., Reliability Issues For Diamond Electron Devices Operated at Hight Temperature (500° C. Aging Effect of PN Diodes), NRC Nissan Motor, NRI, AIST, Mar. 2008, p. 590, 27p-K-13.
M. Suzuki, et al., Space Charge Limited Diamond Diodes, Corporated R&D Center, Toshiba Corp., Mar. 2006, p. 622, 23p-Q-4.
M. Brezeanu et al., Single Crystal Diamond M-i-P Diodes for Power Electronics, Power Semiconductors, IET Circuits, Devices & Syst., 2007, pp. 380-386, vol. 1, No. 5.
Mariko Suzuki et al., Electrical Characterization of Phosphorus-Doped n-Type Homoepitaxial Diamond Layers, Diamond and Related Materials, 2004, pp. 2037-2040, vol. 13.
M. Kubovic et al., Diamond Merged Diode, Diamond and Related Materials, 2007, pp. 1033-1037, vol. 16.
Mutsuhiro Mori et al., 6.5 k V Ultra Soft & Fast Recovery Diode (U-SFD) With High Reverse Recovery Capability, ISPSD, 12$^{th}$ International Symposium on Power Semiconductor Devices and ICS, 2000, pp. 115-118.
European Search Report, Sep. 12, 2013, 7 pages.
Japanese Office Action, Nov. 19, 2013, 6 pages.

* cited by examiner

SEMICONDUCTOR DEVICE

TECHNICAL FIELD

The present invention relates to a semiconductor device formed of a semiconductor material in which an energy level of conductive impurities is located at a deep position beyond a thermal excitation energy at an operating temperature.

BACKGROUND ART

Conventionally, a technique of forming a pn junction diode by using a diamond semiconductor has been known (refer to Non-Patent Document 1). In a diamond semiconductor, an energy level of conductive impurities is located at a deep position beyond a thermal excitation energy at an operating temperature. Specifically, an acceptor and a donor having the shallowest energy levels are B (boron) and P (phosphorus), respectively. However, energy levels of B and P are 0.37 eV and 0.6 eV, respectively, and are greater than 0.026 eV, which is a thermal excitation energy under standard conditions, by one order of magnitude or more. For this reason, a diamond semiconductor cannot have a high carrier density, and hence has an extremely large resistance value. As a result, it is extremely difficult to cause a high density current to flow through a pn junction element formed of a diamond semiconductor. Specifically, the diamond pn diode disclosed in Non-Patent Document 1 has a current density of at most approximately several $A/cm^2$ (8V). This value is lower than that of a pn junction diode formed of silicon carbide, or the like, by two orders of magnitude or more.

The present invention has been made in view of the above-described problem, and an object of the present invention is to provide a semiconductor device which allows a high density current to flow therethrough.

Non-Patent Document 1: M. Kubovic et al., Diamond & Related Materials, Vol. 16 (2007) pp. 1033-1037

SUMMARY OF INVENTION

In a semiconductor device according to the present invention, a first semiconductor having a first conductivity type is joined to a second semiconductor layer having a second conductivity type which is different from the first conductivity type, and having an impurity concentration higher than an impurity concentration of the first semiconductor. In addition, a first electrode is formed to be in rectifying contact with the first semiconductor layer, and a second electrode is formed to be in ohmic contact with the second semiconductor layer.

BRIEF DESCRIPTION OF DRAWINGS

FIGS. 2(*a*)-2(*d*) are energy band diagrams for describing an operating principle of the junction element shown in FIG. 1.

FIGS. 4(*a*)-4(*d*) are process sectional views for describing a flow of a method of manufacturing the junction element shown in FIG. 3.

FIGS. 11(*a*)-11(*d*) are process sectional views for describing a flow of a method of manufacturing the junction element shown in FIG. 10.

FIGS. 13(*a*)-13(*d*) are process sectional views for describing a flow of a method of manufacturing the junction element shown in FIG. 12.

DESCRIPTION OF EMBODIMENTS

Hereinafter, description is given of structures of semiconductor devices, which constitute embodiments of the present invention, with reference to the drawings. Note that the drawings referred to below are schematic, and that relationships between thicknesses and planar dimensions, ratios of thicknesses of layers, and the like are different from actual ones. Accordingly, specific thicknesses and planar dimensions should be determined in consideration of the following description. Moreover, the drawings naturally include portions having different dimensional relationships and ratios from each other. Moreover, in the following, description is made while cases where the present invention is applied to pn junction diodes of diamond semiconductors are taken as examples. However, these are selected for convenience, and the present invention is applicable to any semiconductor material in which at least one of a donor level and an acceptor level is located at a sufficiently deep position beyond a thermal excitation energy at an operating temperature, such as zinc oxide (ZnO), aluminum nitride (AlN), or boron nitride (BN). The present invention is also applicable to even a material having a shallow impurity level at room temperature, such as silicon (Si), silicon carbide (SiC), gallium nitride (GaN), gallium arsenide (GaAs), or germanium (Ge), as long as operation is performed at such a low temperature that the thermal excitation energy can be sufficiently small. Note that, in the following description, a semiconductor substrate in which an epitaxial layer, other films, and electrodes are formed is referred to as a "diamond substrate" or simply a "substrate," unless otherwise stated.

First Embodiment

Structure of Junction Element

Figure 1:
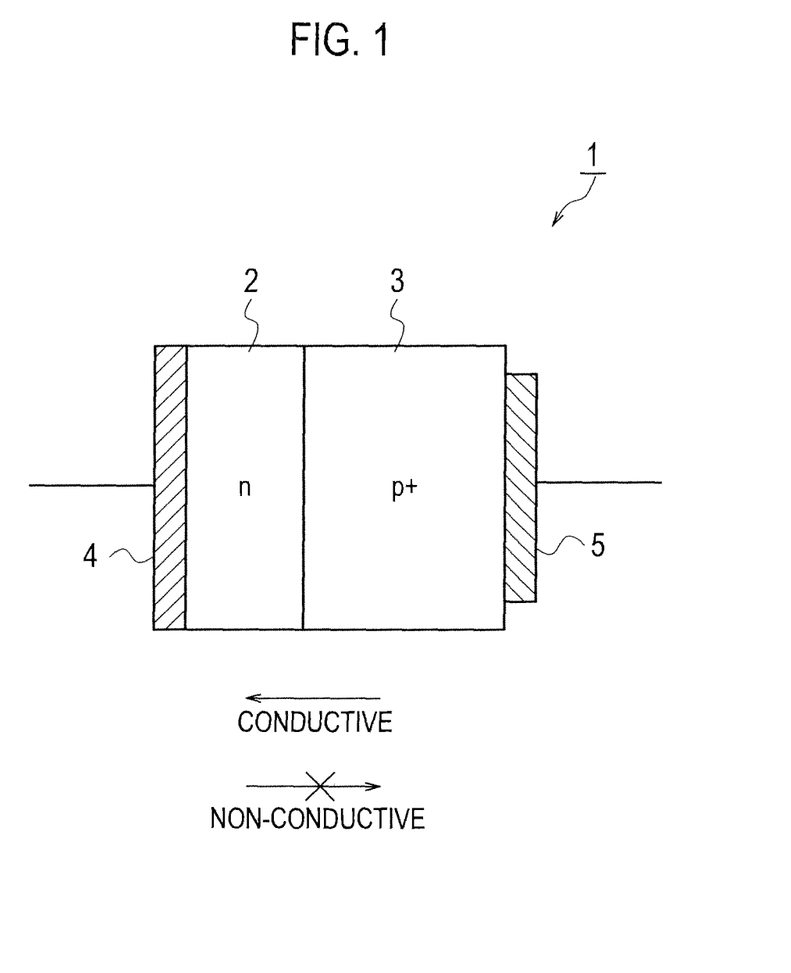
FIG. 1 is a schematic diagram showing a structure of a junction element, which constitutes a first embodiment of the present invention.

First, description is made of a structure of a junction element, which constitutes a first embodiment of the present invention, with reference to FIG. 1. FIG. 1 is a schematic diagram showing the structure of the junction element, which constitutes the first embodiment of the present invention.

As shown in FIG. 1, the junction element 1, which constitutes the first embodiment of the present invention, includes a semiconductor layer 2 of a first conductivity type, a semiconductor layer 3 of a second conductivity type, an electrode layer 4, and an electrode layer 5. The semiconductor layer 3 is joined to the semiconductor layer 2. The electrode layer 4 is in rectifying contact (Schottky contact) with the semiconductor layer 2. The electrode layer 5 is in ohmic contact with the semiconductor layer 3. In this embodiment, the semiconductor layer 2 is formed of an n-type diamond semiconductor. The semiconductor layer 3 is formed of a p-type diamond semiconductor. An impurity concentration in the semiconductor layer 3 is set higher than an impurity concentration in the semiconductor layer 2. Note that the impurity concentration in the semiconductor layer 3 is desirably set higher than the impurity concentration in the semiconductor layer 2 by one order of magnitude or more. In addition, an energy level (a donor level in this embodiment) of conductive impurities in the semiconductor layer 2 is located at a deep position beyond a thermal excitation energy at an operating temperature of the junction element 1 (the so-called deep level). Here, the semiconductor layer 2 is an n-type semiconductor, and the semiconductor layer 3 is a p-type semiconductor. However, the semiconductor layer 2 may be a p-type semiconductor, and the semiconductor layer 3 may be an n-type semiconductor.

As a material constituting each of the electrode layer 4 and the electrode layer 5, a suitable material may be selected without any limitation. However, according to the present invention, the electrode layer 4 and the electrode layer 5 can be formed of the same material. This is for the following reasons. In a case of the generally known pn junction-type diode, both conductive layers are required to be in ohmic contact having a low resistance. However, in a wide band gap semiconductor such as diamond, an electrode material which shows a low contact resistance when being in contact with a conductive layer of one conductivity type exhibits strong rectifying characteristics when being in contact with a conductive layer of the other conductivity type. Hence, a low resistance cannot be obtained. In contrast, the junction element according to the present invention has a structure in which one electrode is in ohmic contact and the other electrode is in Schottky contact. Therefore, contacts of a p-layer and an n-layer can be achieved easily and simultaneously by a single electrode material. An example of a material suitable for such simultaneous contact is titanium (Ti). Ti exhibits a low resistance (ohmic characteristics) to the semiconductor layer 3, whereas exhibits ideal rectifying characteristics (Schottky characteristics) to the semiconductor layer 2. Accordingly, the electrode layer 4 and the electrode layer 4 are desirably formed of the same material. This can shorten the process of forming the electrodes, increase the yield, and also lower the production costs.

Besides the above-described Ti, the material for forming each of the electrode layer 4 and the electrode layer 5 may be aluminum (Al), nickel (Ni), molybdenum (Mo), tungsten (W), tantalum (Ta), platinum (Pt), or the like, and may be an alloy made of two or more elements including any of these elements, a carbide of any of these elements, a nitride thereof, or a silicide thereof. Points in favorably forming both of the electrodes are that materials should be designed so that the contact resistance of the electrode layer 5 can be minimized, and that film formation conditions should be optimized. The thus obtained electrodes themselves are also optimum for the electrode layer 4, and exhibit extremely excellent rectifying characteristics as the electrode layer 4.

[Operating Principle of Junction Element]

Next, description is made of the operating principle of the junction element 1, which constitutes the first embodiment of the present invention, with reference to FIGS. 2(a) to 2(d). FIGS. 2(a) to 2(d) show energy band diagrams of the junction element 1, which constitutes the first embodiment of the present invention. Black circles and white circles in the drawing show electrons and holes which participate in the conduction.

Figure 2:
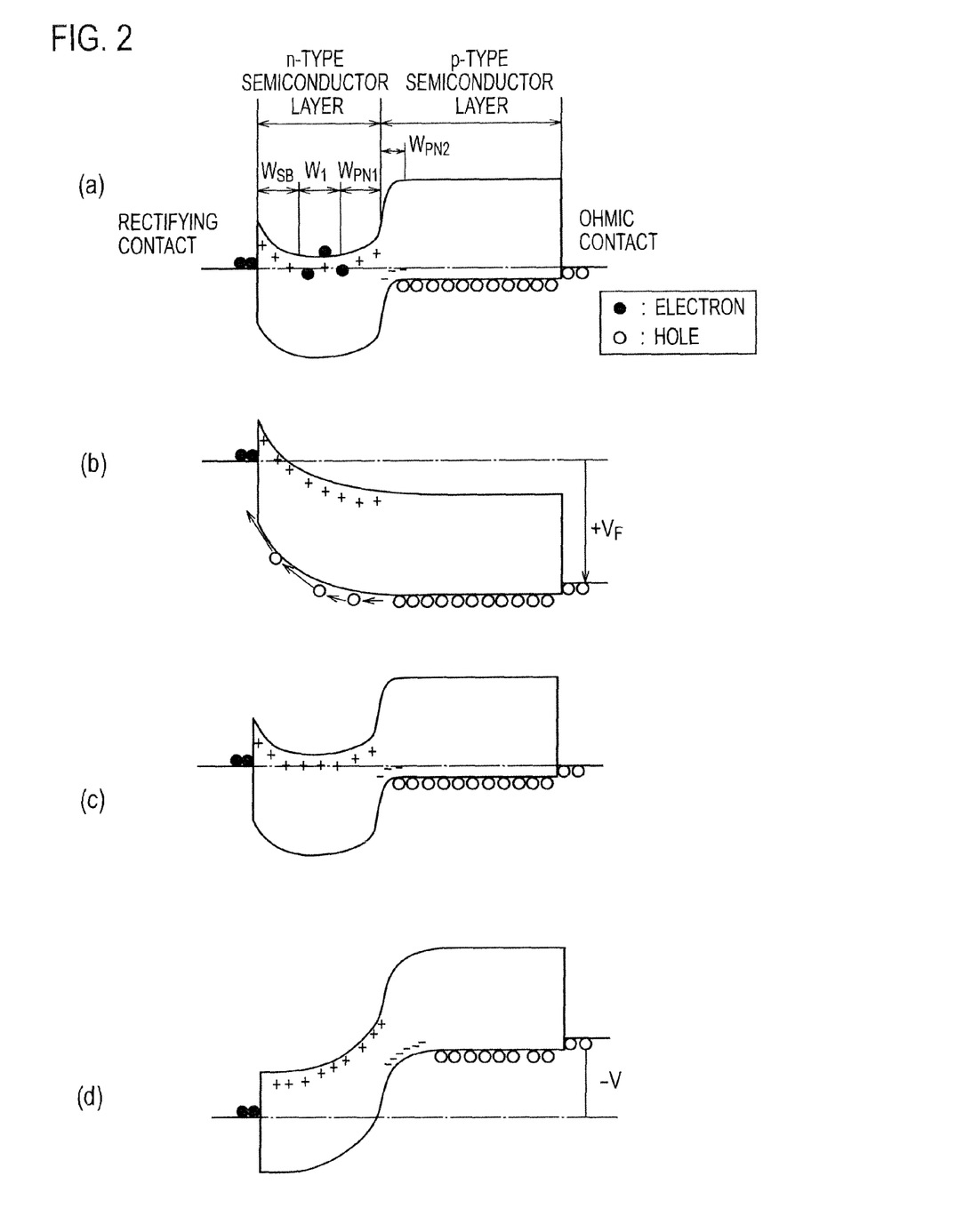

FIG. 2(a) shows an energy band diagram of the junction element 1 placed in a thermal equilibrium state with zero bias. As shown in the drawing, in a thermal equilibrium state with zero bias, a depletion layer having a width of $W_{SB}$ is formed on a left side of the semiconductor layer 2 because of the Schottky contact, and a depletion layer having a width of $W_{PN1}+W_{PN2}$ is formed on a right side of the semiconductor layer 2 because of a pn junction (a bipolar junction) formed by joining the semiconductor layer 2 and the semiconductor layer 3 together. $W_{PN1}$ and $W_{PN2}$ represent widths of the depletion layers which extend from a point of the joining of the pn junction toward the semiconductor layer 2 and toward the semiconductor layer 3, respectively. In addition, a neutral region having a width of $W_1$ is formed between the depletion layers of the semiconductor layer 2, and electrons are present in a conduction band of the neutral region and at a deep donor level. Meanwhile, holes are present in a valence band in the neutral region of the semiconductor layer 3. Note that, in the drawing, an acceptor level of the semiconductor layer 3 is shown as a shallow energy level. When, however, the energy level is deep, holes are present also at the acceptor level.

FIG. 2(b) shows an energy band diagram of the junction element 1 to which a forward voltage $V_F$ is applied. As shown in the drawing, the conduction electrons present in the conduction band of the semiconductor layer 2 are swept into the semiconductor layer 3, and recombined with holes and disappear. Meanwhile, the holes in the semiconductor layer 3 diffuse into the semiconductor layer 2. Then, a part of the holes disappear when recombined with conduction electrons bound at the deep donor level at an initial stage of the application of the forward voltage. However, the majority does not recombine with the conduction electrons, and does not disappear. Instead, the majority passes through the semiconductor layer 2, and is slowly accelerated by a resultant electric field of a diffusion potential of the electrode layer 4 and the forward voltage $V_F$ to reach the electrode layer 4. Meanwhile, electrons present in the electrode layer 4 are blocked by a Schottky barrier between the electrode layer 4 and the semiconductor layer 2, and cannot enter the semiconductor layer 2. In other words, in a state where the forward voltage is applied, electrons cannot be injected into the semiconductor layer 2, and accordingly the entire region is depleted. As a result, the semiconductor layer 2 acts as a good conductor for holes which are minority carriers.

Since the semiconductor layer 2 has a conduction mechanism as described above, the impurity concentration in the semiconductor layer 3 can be set higher than the impurity concentration in the semiconductor layer 2. For this reason, it is also possible to achieve a low resistance of the semiconductor layer 3, and to make the impurity concentration of the semiconductor layer 3 on the order of $10^{19}$ to $10^{20}/cm^3$. As described above, the junction element 1, which constitutes the first embodiment of the present invention, can achieve an extremely low resistance in terms of forward characteristics. In other words, the junction element 1, which constitutes the first embodiment of the present invention, can achieve a higher current density than generally known pn junction-type elements (pn junction diodes and the like).

FIG. 2(c) shows an energy band diagram of the junction element 1 which is returned from the state of the application of the forward voltage to a zero bias state. As shown in the drawing, the energy band of the junction element is substantially the same as the energy band shown in FIG. 2(a). However, the difference lies in that the neutral region in the semiconductor layer 2 disappears, and the semiconductor layer 2 is depleted. This is because donor-bound conduction electrons which have disappeared in the course of the application of the forward voltage are not easily supplied through the electrode layer 4 having the rectifying characteristics, and also because generation of electron hole pairs does not occur in a short period because of the deep gap in the intermediate region. Note that appropriate adjustment of the donor concentration and thickness of the semiconductor layer 2 and the impurity concentration of the semiconductor layer 3 allows the width W1 of the neutral region in the semiconductor layer 2 to be zero in a thermal equilibrium state with zero bias. Specifically, the thickness L1 of the semiconductor layer 2 is desirably adjusted so as to satisfy $L1 \leq W_{SB} + W_{PN1}$ in a thermal equilibrium state, where $W_{SB}$ represents the width of the depletion layer formed in the semiconductor layer 2 by the rectifying contact of the electrode layer 4, and $W_{PN1}$ represents the width of the depletion layer formed on the semiconductor layer 2 side by the pn junction between the semiconductor layer 2 and the semiconductor layer 3. In this case, an energy band diagram as shown in FIG. 2(c) is achieved also in a thermal equilibrium state, and the initial effect can be eliminated.

FIG. 2(d) shows an energy band diagram of the junction element 1 to which a reverse voltage V is applied. As shown in the drawing, as a result of the application of the reverse voltage V to the entire region of the depleted semiconductor layer 2, holes in the semiconductor layer 3 are blocked by a large energy barrier formed at the pn junction portion, and unable to move to the semiconductor layer 2. Meanwhile, since electrons are blocked by the Schottky barrier, and absent in the semiconductor layer 2, electrons cannot flow in the reverse direction (even if electrons are present, the electrons are blocked by the energy barrier of the pn junction, and unable to move to a region in the semiconductor layer 2).

As is apparent from the above description, in the junction element 1, which constitutes the first embodiment of the present invention, the depletion layers are formed in the semiconductor layer 2. Hence, when a forward voltage is applied, electrons present in the electrode layer 4 are unable to move to the semiconductor layer 2. For this reason, a majority of holes in the semiconductor layer 3 do not disappear by the recombination with conduction electrons in the semiconductor layer 2, but can reach the electrode layer 4, while diffused into the semiconductor layer 2. Accordingly, the junction element 1, which constitutes the first embodiment of the present invention, can serve as a good conductor for holes, while avoiding the influence of a resistance value, and allows a current to flow therethrough at a level equal to or more than that achieved by a semiconductor element formed of a Si or SiC semiconductor.

In addition, as is commonly known, in ordinary pn diodes including conventional diamond pn diodes, minority carriers are injected from one of conduction regions facing each other into the other conduction region, and vice versa. Hence, ordinary pn diodes are poor in terms of fast response. For this reason, when such an ordinary pn diode is used as a free wheel diode such as an inverter, switching loss is significant. However, the junction element 1, which constitutes the first embodiment of the present invention, is a semiconductor element which has a pn junction, but actually performs a unipolar operation. Hence, it is possible to transition from a conductive state to a non-conductive state and from a non-conductive state to a conductive state at an extremely high speed. Accordingly, if a conventional pn diode is replaced with the junction element 1, which constitutes the first embodiment of the present invention, the switching loss can be reduced greatly.

Second Embodiment

Structure of Junction Element

Figure 3:
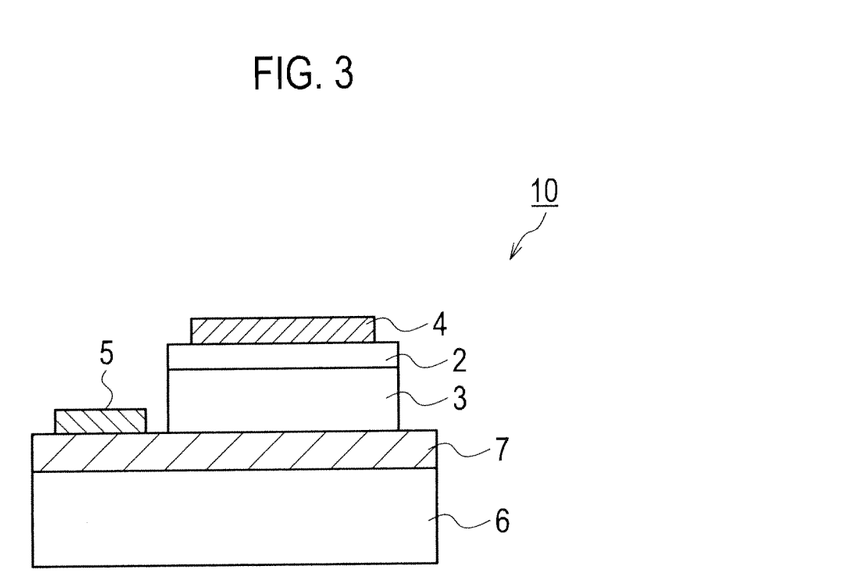
FIG. 3 is a schematic diagram showing a structure of a junction element, which constitutes a second embodiment of the present invention.

Next, description is made of a structure of a junction element, which constitutes a second embodiment of the present invention, with reference to FIG. 3. FIG. 3 is a schematic diagram showing the structure of the junction element, which constitutes the second embodiment of the present invention.

As shown in FIG. 3, a junction element 10, which constitutes the second embodiment of the present invention, includes a substrate 6, a semiconductor layer 7 of a second conductivity type, a semiconductor layer 3 of the second conductivity type, a semiconductor layer 2 of a first conductivity type, an electrode layer 4, and an electrode layer 5. The semiconductor layer 7 is formed on an entire front surface of the substrate 6. The semiconductor layer 3 and the semiconductor layer 2 are sequentially stacked in a mesa shape on a top portion of the semiconductor layer 7. The electrode layer 4 is in rectifying contact with the semiconductor layer 2, and the electrode layer 5 is in ohmic contact with the semiconductor layer 7. In this embodiment, the substrate 6 is formed of a single crystal diamond Ib(001) substrate manufactured by synthesis at high temperature and high pressure. The semiconductor layer 7 is formed of a $p^+$-type diamond semiconductor. The semiconductor layer 3 is formed of a p-type diamond semiconductor, and has an impurity concentration lower than an impurity concentration in the semiconductor layer 7. The semiconductor layer 2 is formed of an n-type diamond semiconductor, and has an impurity concentration lower than the impurity concentration in the semiconductor layer 3. Note that the substrate 6 is not necessarily of the Ib type, and may be a substrate having a different plane orientation, or a polycrystalline substrate. The semiconductor layer 7 is provided to easily obtain the ohmic contact. The semiconductor layer 3 is integrated with the semiconductor layer 7, and the semiconductor layer 7 is used as the second semiconductor layer according to the present invention. Thereby, a higher current density can be obtained. Examples of kinds of impurities, impurity concentrations, and layer thicknesses of the semiconductor layer 2, the semiconductor layer 3, and the semiconductor layer 7 are shown below.

(a) Semiconductor layer 2: P (phosphorus), $7 \times 10^{16}/cm^3$, 0.07 µm (b) Semiconductor layer 3: B (boron), $3.5 \times 10^{18}/cm^3$, 0.7 µm (c) Semiconductor layer 7: B (boron), $4 \times 10^{20}/cm^3$, 1.4 µm

[Method of Manufacturing Junction Element]

Figure 4:
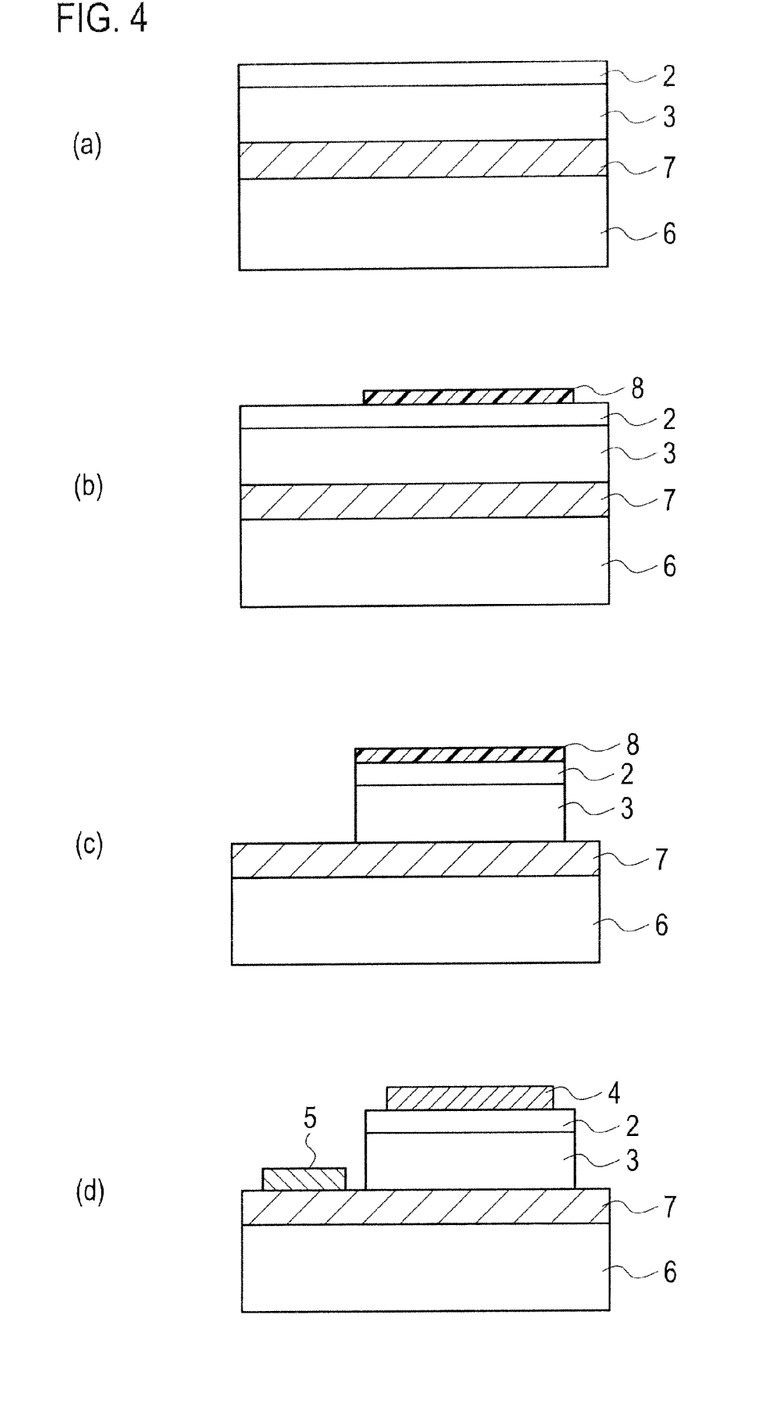

Next, with reference to FIG. 4, description is made of a method of manufacturing the junction element 10, which constitutes the second embodiment of the present invention. FIG. 4 is a process sectional view showing a flow of the method of manufacturing the junction element 10, which constitutes the second embodiment of the present invention.

In manufacturing the junction element 10, first, as shown in FIG. 4(a), the semiconductor layer 7, the semiconductor layer 3, and the semiconductor layer 2 are homoepitaxially grown in this order by using a microwave plasma CVD (chemical vapor deposition) method on a front surface of the diamond Ib(001) substrate 6 obtained by synthesis at high temperature and high pressure and sufficiently washed with a mixed acid of nitric acid and sulfuric acid, or the like. Note that methane ($CH_4$) and hydrogen ($H_2$) can be used as raw material gases of the diamond, diborane ($B_2H_6$) can be used as a p-type impurity gas, and phosphine ($PH_3$) can be used as an n-type impurity gas. In addition, a filament CVD method which is known as a diamond thin film synthesis method as wide as the microwave plasma CVD method may be used.

Next, as shown in FIG. 4(b), a metal mask 8 is formed on a front surface of the semiconductor layer 2 by using a photolithography/vapor deposition/lift-off method. With the metal mask 8 used as an etching mask, etching is performed by an inductively coupled plasma etching (ICP) method or a reactive ion etching (RIE) method, until the semiconductor layer 7 is exposed. Thereby, a mesa structure made of the semiconductor layer 3 and the semiconductor layer 2 as shown in FIG. 4(c) is formed. Note that when the film thicknesses of the semiconductor layer 2 and the semiconductor layer 3 are small, the process may be simplified by using a photoresist mask as the etching mask.

Next, the metal mask 8 is peeled by using a liquid mixture of sulfuric acid with an aqueous solution of hydrogen peroxide, or the like. Then, the substrate 6 is sufficiently washed with a mixed acid of nitric acid and sulfuric acid, or the like. Thereafter, as shown in FIG. 4(d), by using a photolithography/vapor deposition/lift-off method or a vapor deposition/photolithography/etching method, the electrode layer 4 and the electrode layer 5 having their respective desired shapes are formed at once on front surfaces of the semiconductor layer 2 and the semiconductor layer 7, respectively. Then, finally, if necessary, a heat treatment is performed in vacuo or in an atmosphere of inert gas at 420° C. for 30 minutes, in order to reinforce the adhesion between the semiconductor layer 2 and the electrode layer 4 and the adhesion between the semiconductor layer 7 and the electrode layer 5. This completes the series of manufacturing steps. Note that a film of a different metal (such as Pt, Au, or Al) may be stacked on each of the electrode layer 4 and the electrode layer 5 in order to reduce the electrode resistances (Note: not contact resistances). In addition, in the above description, the electrode layer 4 and the electrode layer 5 are formed of the same material at once. Alternatively, the electrode layer 4 and the electrode layer 5 may be stacked sequentially so that the electrode layer 4 can show ohmic characteristics, and the electrode layer 5 can show Schottky characteristics.

Experimental Example

Figure 5:
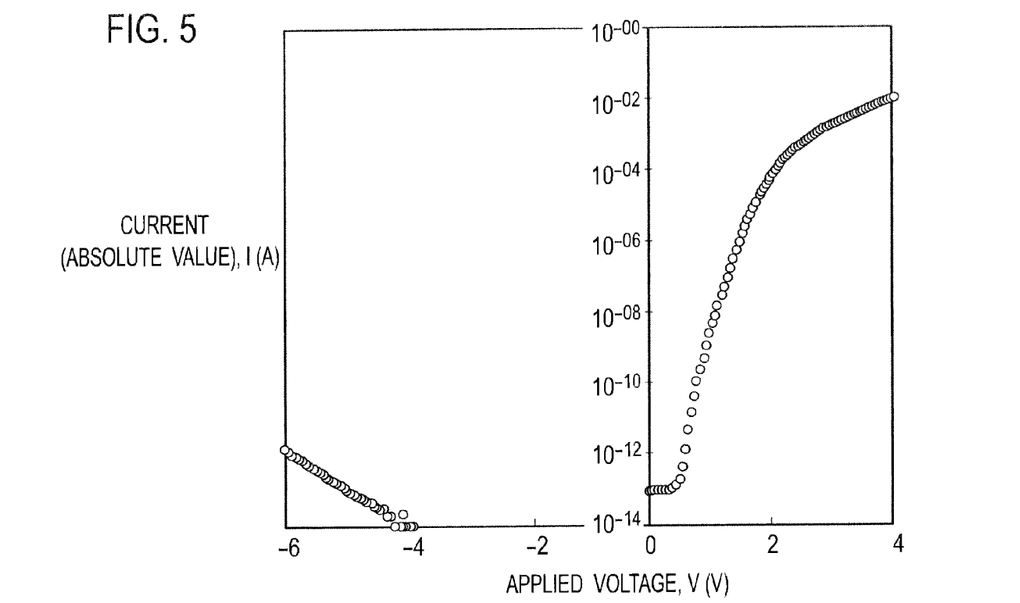
FIG. 5 is a graph showing current-voltage characteristics of the junction element shown in FIG. 3.

FIG. 5 shows IV characteristics of the junction element 10 manufactured by the above-described manufacturing method (mesa diameter: 70 μm). Note that in the drawing, the vertical axis represents the logarithm of absolute value of current. As shown in the drawing, when an applied voltage V=0 to −4 [V], the current value was at or below the detection limit of the measuring apparatus, and was not successfully determined. This showed that extremely favorable rectification characteristics were obtained. Note that, when a rectification ratio is calculated at an applied voltage V=±4 V, the achieved rectification ratio of the junction element 10 was approximately a twelve-digit number. This value is higher than a rectification ratio of the ordinary pn junction diode described in Non-Patent Document 1 by two orders of magnitude or more.

Figure 6:
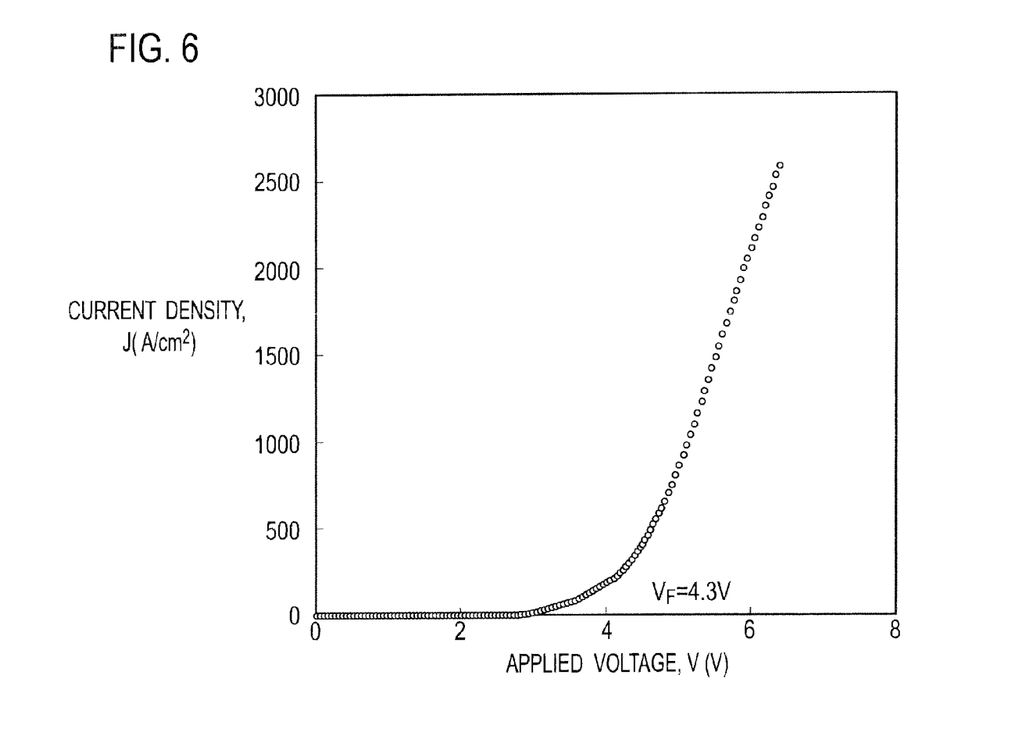
FIG. 6 is a graph showing forward current density-voltage characteristics of the junction element shown in FIG. 3.

FIG. 6 shows measurement results of forward characteristics of the same junction element 10 as that in FIG. 5 in a wider measurement region. In FIG. 6, the vertical axis represents the current density plotted on a linear axis. As shown in the graph, the current rises at around an applied voltage V=3 V, and then the current increases linearly. It was determined by extrapolation of an approximate straight line that an ON voltage $V_F$ was 4.3 V. In addition, an ON-resistivity $R_{ON}S$ of the pn diode was calculated to be 0.8 mΩcm² from a slope of the straight line. Note that this value is extremely lower than conventionally known ON-resistivities $R_{ON}S$.

Meanwhile, when the focus is placed on the current density, the value of the current density of the junction element 10 was 1000 times as high as or even higher than the ordinary pn junction diode described in Non-Patent Document 1. In addition, the applied voltage was 2 V lower than a bias voltage of the ordinary pn junction diode described in Non-Patent Document 1. This means that the junction element 10, which constitutes the second embodiment of the present invention, solves, by a totally different method, the problem of the ordinary pn junction diode described in Non-Patent Document 1 that a large current density cannot be achieved because of high internal resistance.

Figure 7:
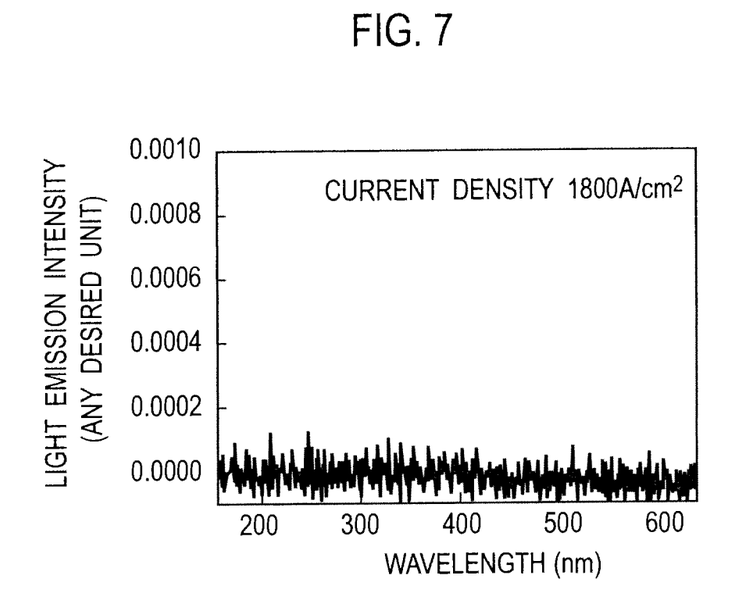
FIG. 7 shows light emission characteristics obtained when a forward voltage is applied to the junction element shown in FIG. 3.

FIG. 7 shows light emission characteristics obtained when a forward voltage is applied to the same junction element 10 as that of FIGS. 5 and 6. When a forward voltage is applied to a general pn junction diode, minority carriers are injected from one of conduction regions facing each other into the other conduction region, and vice versa. As a result, light emission attributable to recombination of electrons and holes is observed. In a case of a diamond pn diode, a sharp light emission due to excitons is observed at a wavelength of 235 nm, and broad light emission from defect levels is observed in a wavelength region of 300 nm to 700 nm. In contrast, in the case of the junction element 10, even when a large current (current density: 1800 A/cm²) was injected, light emission was not observed at all as shown in FIG. 7. This indicates that the junction element 10 is a semiconductor element which has a pn junction, but actually performs a unipolar operation.

Third Embodiment

Structure of Junction Element

Figure 8:
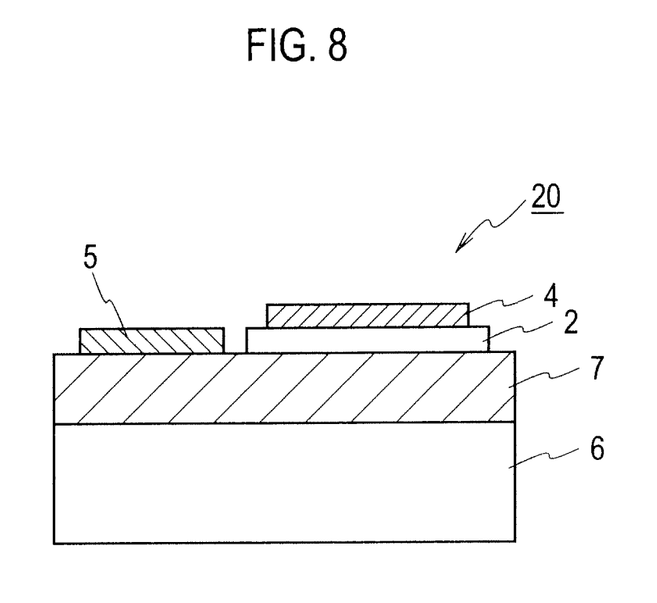
FIG. 8 is a schematic diagram showing a structure of a junction element, which constitutes a third embodiment of the present invention.

In the junction element, which constitutes the second embodiment, the semiconductor layer 7 is provided under the semiconductor layer 3 serving as the second semiconductor layer, in order to easily obtain the ohmic contact. For this reason, in the junction element, which constitutes the second embodiment, the current density in forward operation is determined mainly by a resistance component of the semiconductor layer 3. Accordingly, in this embodiment, the semiconductor layer 7 is used as the second semiconductor layer by integrating the semiconductor layer 3 and the semiconductor layer 7 with each other. Thereby, the resistance of the second semiconductor layer is reduced, and a larger current density is achieved. Hereinafter, with reference to FIG. 8, description is made of a structure of a junction element, which constitutes a third embodiment of the present invention. FIG. 8 is a schematic diagram showing a structure of the junction element, which constitutes the third embodiment of the present invention.

As shown in FIG. 8, the junction element 20, which constitutes the third embodiment of the present invention, includes a substrate 6, a semiconductor layer 7 of a second conductivity type, a semiconductor layer 2 of a first conductivity type, an electrode layer 4, and an electrode layer 5. The semiconductor layer 7 is formed on an entire front surface of the substrate 6. The semiconductor layer 2 is formed on a top portion of the semiconductor layer 7. The electrode layer 4 is in rectifying contact with the semiconductor layer 2. The electrode layer 5 is in ohmic contact with the semiconductor layer 7. In this embodiment, the substrate 6 is formed of a single crystal diamond Ib(001) substrate manufactured by synthesis at high temperature and high pressure. The semiconductor layer 7 is formed of a p⁺-type semiconductor. The semiconductor layer 2 is formed of an n-type diamond semiconductor, and has an impurity concentration lower than the impurity concentration in the semiconductor layer 7. Note that the substrate 6 is not necessarily of the Ib type, and may be a substrate having a different plane orientation, or a polycrystalline substrate. Examples of kinds of impurities, impurity concentrations, and layer thicknesses of the semiconductor layer 2 and the semiconductor layer 7 are shown below.

(a) Semiconductor layer 2: P (phosphorus), $7 \times 10^{16}/cm^3$, 0.16 µm (b) Semiconductor layer 7: B (boron), $5 \times 10^{20}/cm^3$, 5 µm As the semiconductor layer 7, not only a semiconductor layer exhibiting conduction characteristics as a general p-type semiconductor, but also a semiconductor layer exhibiting hopping conduction or impurity band conduction may be used, as long as a Fermi level and a valence band are not degenerate. If the Fermi level and the valence band in the semiconductor layer 7 are degenerate, the semiconductor layer 7 exhibits metal-like conduction characteristics, and cannot form a pn diode. In contrast, when the Fermi level and the valence band in the semiconductor layer 7 are not degenerate, a pn diode can be formed even in a case where the semiconductor layer 7 exhibits the hopping conduction or the impurity band conduction. Since diamond has a dielectric constant of as low as 5.7 (approximately a half of the dielectric constant of silicon), the acceptor level of boron is as deep as 360 meV. Accordingly, regarding conduction characteristics at a boron concentration of $5 \times 10^{20}/cm^3$, hopping conduction via boron atoms is exhibited. However, the Fermi level and the valence band are not degenerate yet. For this reason, in a case of diamond, even the semiconductor layer 7 whose boron concentration is as high as $5 \times 10^{20}/cm^3$ can form a pn junction with the semiconductor layer 2. As a material of each of the electrode layers 4 and 5, a suitable material may be selected without any limitation. However, the same material may be used for both the electrode layers 4 and 5, as in the case of the above-described embodiments. An example of the same electrode material is titanium (Ti). Titanium exhibits a favorable ohmic contact with the semiconductor layer 7, and ideal rectifying characteristics for the semiconductor layer 2.

[Method of Manufacturing Junction Element]

A method of manufacturing the junction element 20, which constitutes the third embodiment of the present invention, is the same as the method of manufacturing the junction element 10, which constitutes the second embodiment, except that the step of forming the semiconductor layer 3 is eliminated. Hence, description of the method is omitted in the following.

Experimental Example

Figure 9:
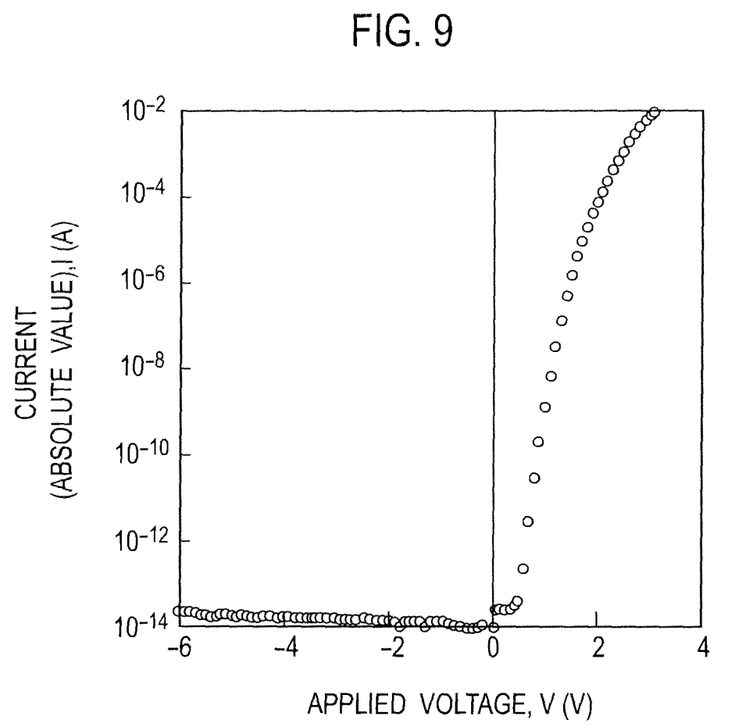
FIG. 9 is a graph showing current-voltage characteristics of the junction element shown in FIG. 8.

FIG. 9 shows IV characteristics of the junction element 20 manufactured by the above-described manufacturing method (mesa diameter: 70 µm). Note that in the drawing, the vertical axis represents the logarithm of absolute value of current. The graph shows that extremely excellent rectification characteristics (a twelve digit number or more at V=±4V) was obtained. In addition, while a leak current was suppressed at or below $10^{-13}$ A up to a reverse bias of 6 V, the current already reached $10^{-2}$ A at a forward bias of 3 V. This achieved current is greater than the current (approximately $10^{-13}$ A at a forward bias of 3V, refer to FIG. 6) achieved by the junction element of the first embodiment by approximately one order of magnitude. In addition, an ON-resistivity $R_{ON}S$ of this junction element 20 was 0.1 mΩcm² or less, and a current density J at a forward bias of 4 V reached 3200 A/cm². As described above, the values of the rectification ratio, the ON-resistivity, and the current density achieved by the junction element 20, which constitutes the third embodiment of the present invention, exhibited superior performances to those of the junction element, which constitutes the first embodiment.

Fourth Embodiment

Structure of Junction Element

Figure 10:
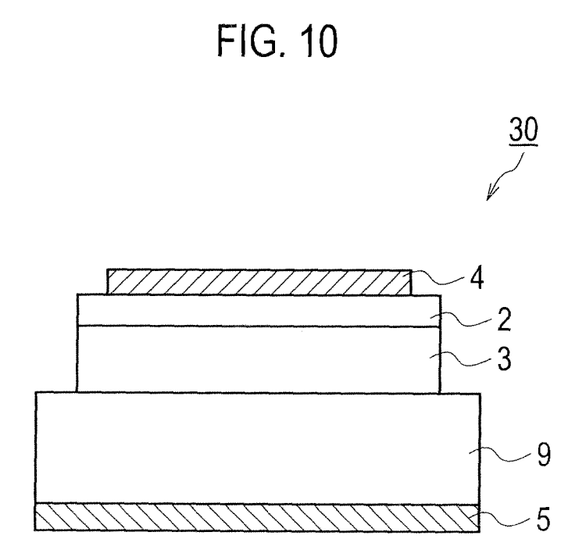
FIG. 10 is a schematic diagram showing a structure of a junction element, which constitutes a fourth embodiment of the present invention.

Next, description is made of a structure of a junction element, which constitutes a fourth embodiment of the present invention, with reference to FIG. 10. FIG. 10 is a schematic diagram showing the structure of the junction element, which constitutes the fourth embodiment of the present invention.

As shown in FIG. 10A, the junction element 30, which constitutes the fourth embodiment of the present invention, includes a substrate 9, a semiconductor layer 3, a semiconductor layer 2, an electrode layer 4, and an electrode layer 5. The semiconductor layer 3 and the semiconductor layer 2 are sequentially stacked in a mesa shape on a front surface side of the substrate 9. The electrode layer 4 is in rectifying contact with the semiconductor layer 2. The electrode layer 5 is in ohmic contact with the substrate 9 on a back surface side thereof. In this embodiment, the substrate 9 is formed of a high concentration boron-doped (200 ppm) low resistance p⁺-type single crystal diamond IIb(001) substrate manufactured by synthesis at high temperature and high pressure. The semiconductor layer 3 is formed of a p-type diamond semiconductor, and has an impurity concentration lower than an impurity concentration of the substrate 9. The semiconductor layer 2 is formed of an n-type diamond semiconductor, and has an impurity concentration lower than the impurity concentration of the semiconductor layer 3. Note that the substrate 9 may be of other types as long as the resistance is low, and may be a substrate having a different plane orientation, or a low resistance polycrystalline substrate. Moreover, a p⁺-type epitaxial layer may be interposed between the substrate 9 and the semiconductor layer 3. In addition, by integrating the semiconductor layer 3 with the substrate 9, the substrate 9 itself may be used as the second semiconductor layer according to the present invention.

[Method of Manufacturing Junction Element]

Figure 11:
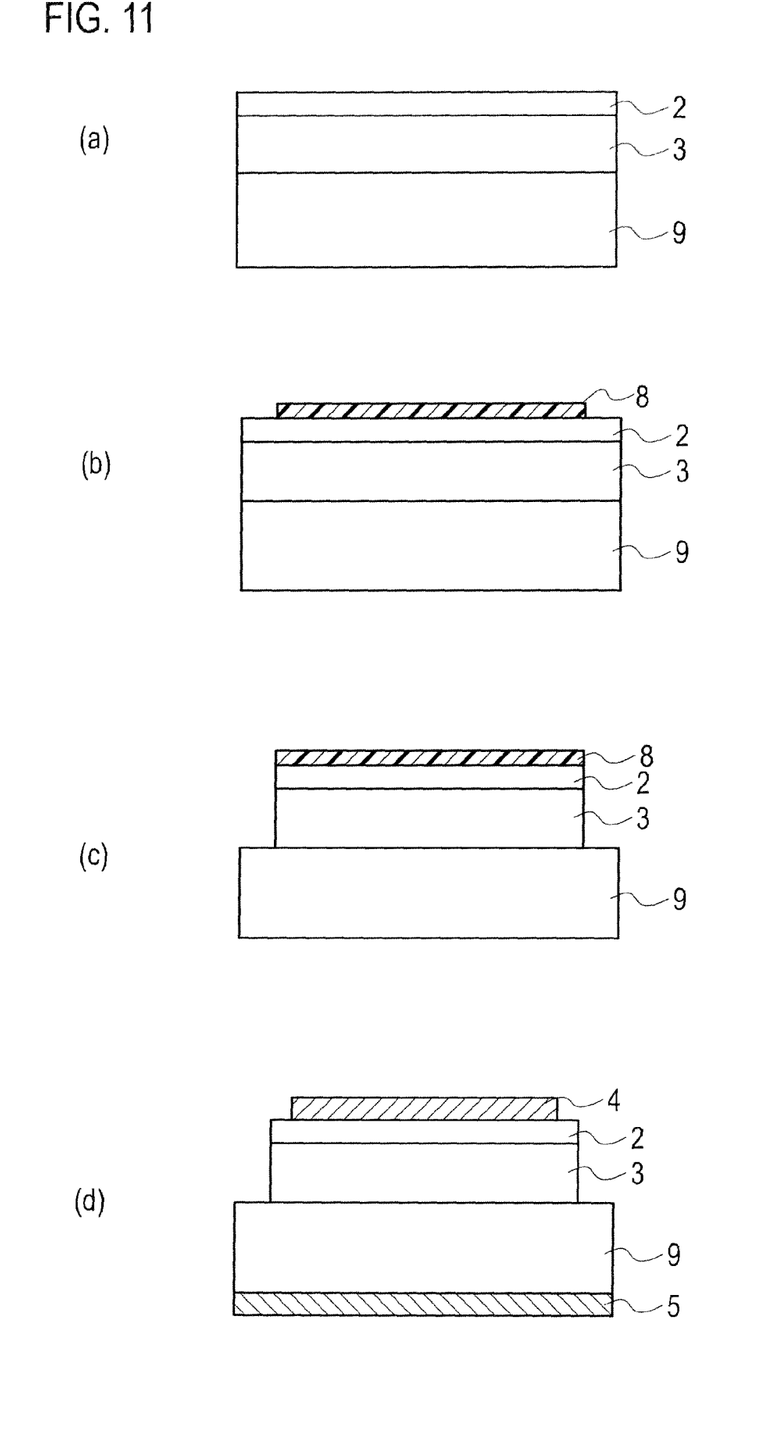

Next, with reference to FIG. 11, description is made of a method of manufacturing the junction element 30, which constitutes the fourth embodiment of the present invention. FIG. 11 is a process sectional view showing a flow of the method of manufacturing the junction element 30, which constitutes the fourth embodiment of the present invention.

In manufacturing the junction element 30, first, as shown in FIG. 11(a), the semiconductor layer 3 and the semiconductor layer 2 are sequentially homoepitaxially grown by using a generally known microwave plasma CVD method or filament CVD method on a front surface of the high concentration boron-doped low resistance p⁺-type single crystal diamond IIb(001) substrate 9 which has been sufficiently washed with a mixed acid of nitric acid and sulfuric acid, or the like. Next, as shown in FIG. 11(b), the metal mask 8 is formed on a front surface of the semiconductor layer 2 by using a photolithography/vapor deposition/lift-off method. Then, with the metal mask 8 used as an etching mask, etching is performed by an inductively coupled plasma etching (ICP) method or a reactive ion etching (RIE) method until a front surface of the substrate 9 is exposed. Thereby, a mesa structure made of the semiconductor layer 3 and the semiconductor layer 2 as shown in FIG. 11(c) is formed. Note that the process may be simplified by using a photoresist mask instead of the metal mask 8.

Next, the metal mask 8 is peeled by using a liquid mixture of sulfuric acid and an aqueous solution of hydrogen peroxide, or the like. Then, the substrate 9 is sufficiently washed with a mixed acid of nitric acid and sulfuric acid, or the like. Next, as shown in FIG. 11(d), the electrode layer 4 in a desired shape is formed on a front surface of the semiconductor layer 2 by using a photolithography/vapor deposition/lift-off method or a vapor deposition/photolithography/etching method. Then, the electrode layer 5 is formed on an entire back surface of the substrate 9 by vapor deposition. Then, finally, if necessary, a heat treatment is performed in vacuo or in an atmosphere of inert gas at 420° C. for 30 minutes in order to reinforce the adhesion between the semiconductor layer 2 and the electrode layer 4 and the adhesion between the substrate 9 and the electrode layer 5. This completes the series of manufacturing steps. Note that, in this embodiment, the electrode layer 4 and the electrode layer 5 are sequentially formed. However, the electrode layer 4 and the electrode layer 5 may be formed of the same material at once.

Experimental Example

Measurement was conducted for electrical characteristics of the junction element 30 manufactured by the above-described manufacturing method. As a result, favorable rectification characteristics which were equal to those of the junction element 1 of the first embodiment were obtained. In addition, forward characteristics of the junction element 30 were analyzed in detail. As a result, it was found that performances exceeding those of the junction element 1 of the first embodiment were obtained, where the ON-resistance $R_{ON}S$ was 0.5 mΩcm$^2$, and the current density J was 4000 A/cm$^2$. The junction element 10, which constitutes the above-described second embodiment, has a structure in which the electrode layer 5 is disposed on the front surface side of the substrate 6. Accordingly, the front surface of the substrate 6 cannot be used effectively. In addition, with this structure, a current flowing from the electrode layer 5 is conducted in parallel with a surface of the substrate via the semiconductor layer 7. Hence, the contact resistance of the electrode layer 5 and the resistance component of the semiconductor layer 7 become high. In contrast, in this embodiment, since the electrode layer 5 is disposed on the back surface side of the substrate 9, the front surface of the substrate 6 can be used effectively. In addition, since a current from the electrode layer 5 enters the substrate 9 and the pn junction perpendicularly thereto and uniformly, it is possible to prevent the rise in the contact resistance of the electrode layer 5 and the resistance component of the substrate 9.

Fifth Embodiment

Structure of Junction Element

Figure 12:
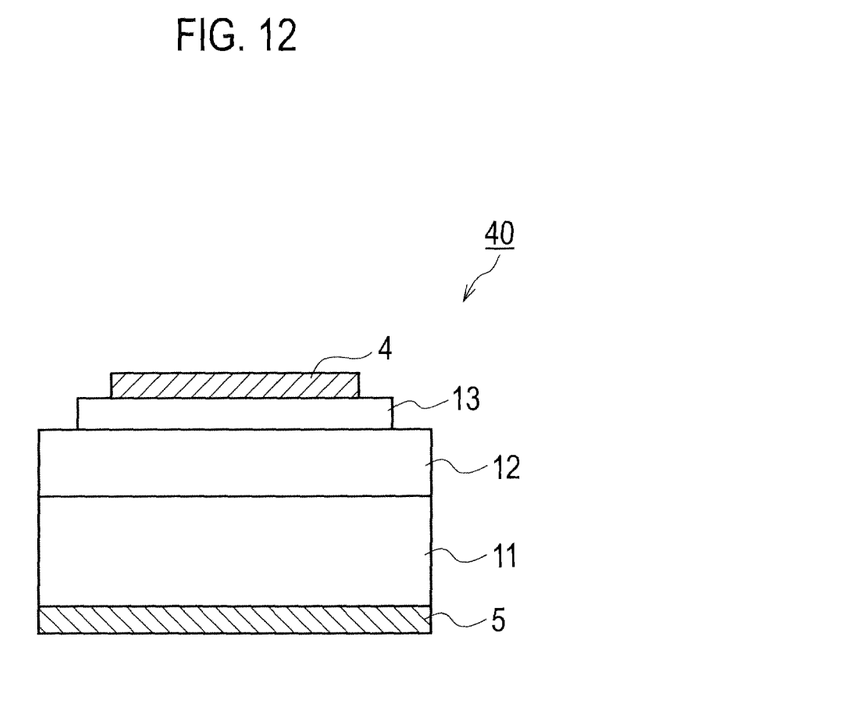
FIG. 12 is a schematic diagram showing a structure of a junction element, which constitutes a fifth embodiment of the present invention.

Next, description is made of a structure of a junction element, which constitutes a fifth embodiment of the present invention, with reference to FIG. 12. FIG. 12 is a schematic diagram showing the structure of the junction element, which constitutes the fifth embodiment of the present invention.

As shown in FIG. 12, the junction element 40, which constitutes the fifth embodiment of the present invention, includes a substrate 11 of a first conductivity type, a semiconductor layer 12 of the first conductivity type, a semiconductor layer 13 of a second conductivity type which is different from the first conductivity type, an electrode layer 4, and an electrode layer 5. The semiconductor layer 12 is formed on an entire front surface of the substrate 11. The semiconductor layer 13 is formed in a mesa shape on a top portion of the semiconductor layer 12. The electrode layer 4 is in rectifying contact with the semiconductor layer 13. The electrode layer 5 is in ohmic contact with the semiconductor layer 11. In this embodiment, the substrate 11 is formed of a high N (nitrogen)-doped low resistance n$^+$-type single crystal 4H—SiC substrate (resistivity: 15 mΩcm) formed by a sublimation method, and has an 8°-off (0001) Si plane on a front surface. The semiconductor layer 12 is a high nitrogen-doped ($N_D$>10$^{18}$ cm$^{-3}$) n$^+$-type conductive layer, and has a thickness of 0.5 μm. The semiconductor layer 13 is constituted of a p$^-$-type 4H—SiC doped with a trace amount of impurities whose acceptor level is sufficiently deep beyond the thermal energy at room temperature, such as boron (B). The semiconductor layer 13 has a thickness of 0.2 and an impurity concentration which is set at least lower than $N_A$=10$^{16}$ cm$^{-3}$. Note that the substrate 11 may be in a different polymorphic form, and the plane orientation and the off-angle are not limited to the above. In addition, if the substrate 11 has a high quality, the mesa shaped semiconductor layer 13 may be formed directly on the substrate 11 without providing the semiconductor layer 12.

As a material forming the electrode layer 4, a material which forms a large Schottky barrier against the semiconductor layer 13 is selected. Examples of such a material include titanium (Ti), nickel (Ni), molybdenum (Mo), tungsten (W), tantalum (Ta), and the like; an alloy made of two or more elements including one of these elements; and carbides, nitrides, and silicides of these elements. Points in favorably forming both of the electrodes are that the materials should be designed so that the contact resistance of the electrode layer 5 can be minimized, and that film formation conditions should be optimized. The thus obtained electrodes themselves are also optimum for the electrode layer 4, and exhibit extremely excellent rectifying characteristics as the electrode layer 4. As a material for forming the electrode layer 5, a low resistance material capable of achieving low-resistance ohmic contact with the substrate 11 is selected. A Ni$_2$Si film formed by applying a heat treatment on a Ni deposition film is most suitable as such a material. However, the material is not limited thereto, and a deposition film of cobalt (Co), Ta, Ti, or Mo, or a heat-treated film thereof may be used as the material.

[Method of Manufacturing Junction Element]

Figure 13:
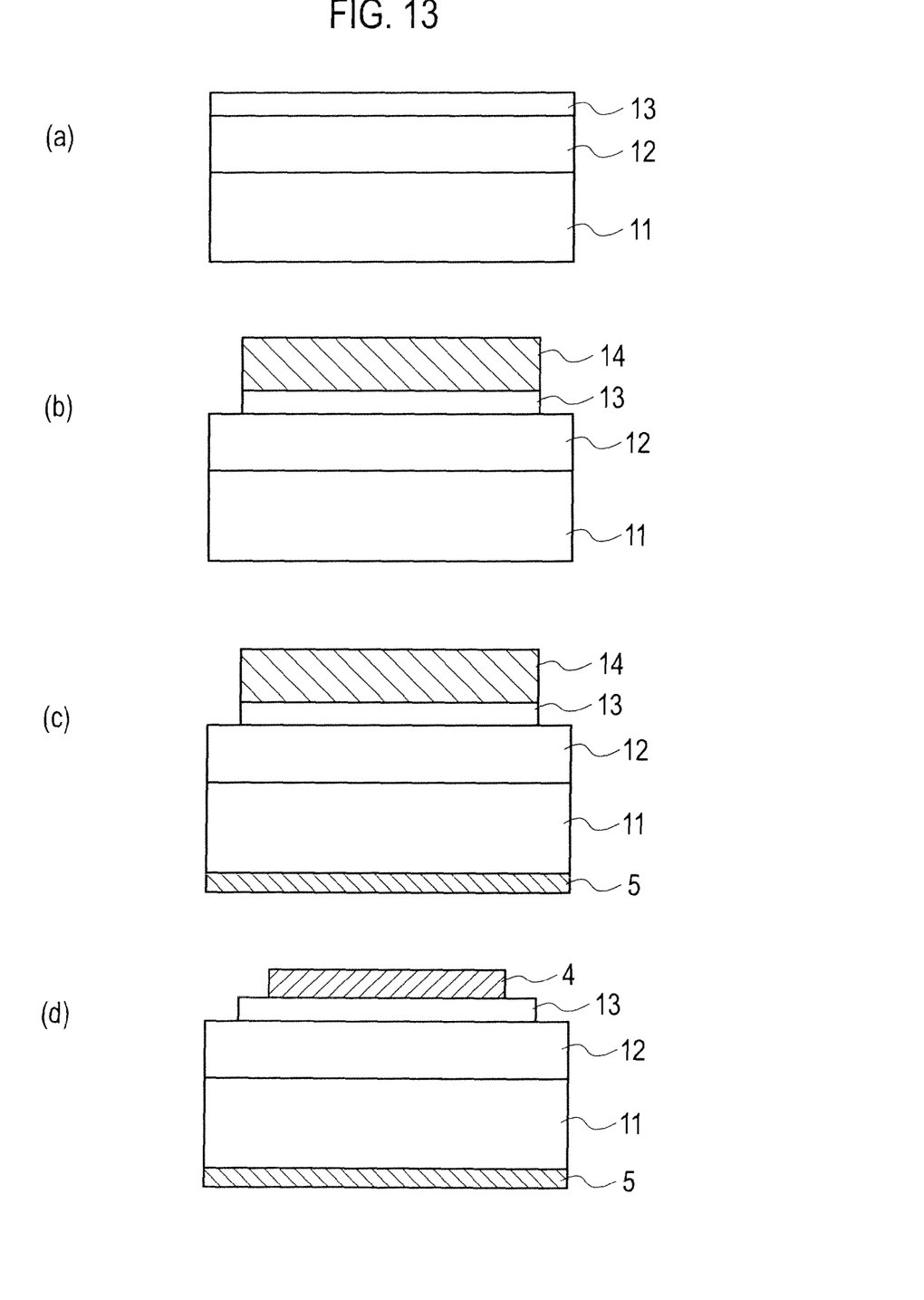

Next, with reference to FIG. 13, description is made of a method of manufacturing the junction element 40, which constitutes the fifth embodiment of the present invention. FIG. 13 is a process sectional view showing a flow of the method of manufacturing the junction element 40, which constitutes the fifth embodiment of the present invention.

In manufacturing the junction element 40, first, as shown in FIG. 13(a), the semiconductor layer 12 and the semiconductor layer 13 are sequentially epitaxially grown by using a commonly known normal pressure CVD method on the front surface of the (0001)Si plane of the substrate 11 which has been sufficiently washed by a publicly known RCA washing method. Then, the substrate 11 is thermally oxidized, (note that since a thermal oxide film is thin, the thermal oxide film is not shown in the drawing). Next, a SiO$_2$ mask 14 having a film thickness of 1.5 μm is formed on a front surface of the semiconductor layer 13, by using a SiO$_2$ normal pressure CVD/photolithography/dry etching method. Then, with the SiO$_2$ mask 14 used as an etching mask, etching is performed by an inductively coupled plasma etching (ICP) method or a reactive ion etching (RIE) method until a front surface of the semiconductor layer 12 (or the substrate 11) is exposed. Thereby, a mesa structure of the semiconductor layer 13 as shown in FIG. 13(b) is formed.

Next, the substrate 11 is slightly etched with a buffered hydrofluoric acid. Thereby, the thermal oxide film on the back surface of the substrate 11 is removed, and a bulk surface of the substrate 11 is exposed. Then, a film of Ni of approximately 50 nm is formed on an entire back surface of the substrate 11 by an electron beam deposition method. Immediately thereafter, the substrate 11 is subjected to a high-speed heat treatment in a high purity nitrogen atmosphere at 1000° C. Thereby, as shown in FIG. 13(c), the electrode layer 5 is formed on the back surface side of the substrate 11. Next, the substrate 11 is immersed in a buffered hydrofluoric acid. Thereby, the SiO2 mask 14 and a thin thermal oxide film formed thereunder are completely removed. Thus, a mesa shaped substrate surface is exposed. Then, finally, as shown in FIG. 13(d), by using a photolithography/vapor deposition/lift-off method or a vapor deposition/photolithography/etching method, the electrode layer 4 in a desired shape is formed on a front surface of the semiconductor layer 13. This completes the series of manufacturing steps.

Experimental Example

Measurement was made for electrical characteristics of the junction element 40 manufactured by the above-described manufacturing method. As a result, as in the case of the diamond semiconductor device, an On-resistance which is extremely lower than that of the ordinary SiC-pn diode and a large current density were obtained.

As described above, description has been made of the embodiments to which the invention achieved by the inventors of the present invention is applied. However, the description and drawings which constitute part of this disclosure of the present invention on the basis of the embodiments do not limit the present invention. For example, in the above-described embodiment, the semiconductor materials for the semiconductor layer 2 and the semiconductor layer 3 are the same. However, the junction elements according to the present invention can exhibit similar effects in a heterojunction pn diode in which the pn junction is formed of semiconductor materials of different kinds, although a certain limitation is present. Specifically, when, of the two semiconductor materials forming the heterojunction, the semiconductor material having a narrower band gap serves as the semiconductor layer 2, a high current density and a low On-resistance can be achieved by applying the present invention. Note that the present invention is not effective for a reverse configuration. As described above, the present invention include other embodiments, examples, operational techniques, and the like made on the basis of the embodiments by those skilled in the art, as a matter of course.

INDUSTRIAL APPLICABILITY

The present invention can provide a semiconductor device which allows a high density current to flow therethrough.

The invention claimed is:

1. A diode device having a first electrode and a second electrode, comprising:
    a first semiconductor layer of a first conductivity type, the first semiconductor layer including impurities at a first impurity concentration; and
    a second semiconductor layer of a second conductivity type which is different from the first conductivity type, the second semiconductor layer being joined to the first semiconductor layer and including impurities at a second impurity concentration which is higher than the first impurity concentration,
    wherein the first electrode is in rectifying contact with the first semiconductor layer and is not in contact with the second semiconductor layer,
    wherein the second electrode is in ohmic contact with the second semiconductor layer and is not in contact with the first semiconductor layer,
    wherein voltage is applied between the first electrode and the second electrode for rectifying the voltage when using the diode device, and
    wherein an energy level of conductive impurities in the first semiconductor layer is located at a deep position beyond a thermal excitation energy at an operating temperature of the diode device.

2. The diode device according to claim 1, further comprising a substrate, wherein
    the second semiconductor layer is disposed on an entire front surface of the substrate, and
    the first semiconductor layer is stacked in a mesa shape on a front surface of the second semiconductor layer.

3. The diode device according to claim 1, wherein the first impurity concentration is lower than the second impurity concentration by at least one order of magnitude or more.

4. A diode device having a first electrode and a second electrode, comprising:
    a first semiconductor layer of a first conductivity type, the first semiconductor layer including impurities at a first impurity concentration; and
    a second semiconductor layer of a second conductivity type which is different from the first conductivity type, the second semiconductor layer being joined to the first semiconductor layer and including impurities at a second impurity concentration which is higher than the first impurity concentration,
    wherein the first electrode is in rectifying contact with the first semiconductor layer,
    wherein the second electrode is in ohmic contact with the second semiconductor layer, and
    wherein a thickness L1 of the first semiconductor layer satisfies $L1 \leq W_{SB} + W_{PN1}$ in a thermal equilibrium state, where $W_{SB}$ represents a width of a depletion layer formed in the first semiconductor layer by the rectifying contact of the first electrode, and $W_{PN1}$ represents a width of a depletion layer formed on a first semiconductor layer side by a bipolar junction between the first semiconductor layer and the second semiconductor layer.

5. The diode device according to claim 1, wherein the diode device is constituted by using one selected as a main material from diamond (C), silicon carbide (SiC), zinc oxide (ZnO), aluminum nitride (AlN), and boron nitride (BN).

6. The diode device according to claim 1, wherein the diode device is manufactured with an intention of operation at a low temperature which is not more than ordinary temperature, and is constituted by using any one of silicon carbide (SiC), gallium nitride (GaN), gallium arsenide (GaAs), silicon (Si), and germanium (Ge) as a main material.

7. The diode device according to claim 1, wherein the first electrode and the second electrode are formed of an identical electrode material.

8. The diode device according to claim 1, wherein at least one of the first electrode and the second electrode is formed of one element selected from titanium (Ti), aluminum (Al), nickel (Ni), molybdenum (Mo), tungsten (W), tantalum (Ta), and platinum (Pt); or an alloy made of two or more elements including one of these elements; or one selected from carbides, nitrides, and silicides of these elements.

9. The diode device according to claim 1, wherein a band gap of the first semiconductor layer is smaller than a band gap of the second semiconductor layer.

10. The diode device according to claim 1, wherein the first electrode and the second electrode are different polarity electrodes.

\* \* \* \* \*